United States Patent
Otanicar et al.

(10) Patent No.: US 11,901,859 B1
(45) Date of Patent: Feb. 13, 2024

(54) PHOTOVOLTAIC DEVICE FOR ENHANCING POWER OUTPUT OF CONCENTRATING SOLAR THERMAL POWER PLANTS

(71) Applicant: The University of Tulsa, Tulsa, OK (US)

(72) Inventors: Todd Otanicar, Tulsa, OK (US); Matthew Orosz, Cambridge, MA (US)

(73) Assignee: The University of Tulsa, Tulsa, OK (US)

( * ) Notice: Subject to any disclaimer, the term of this patent is extended or adjusted under 35 U.S.C. 154(b) by 502 days.

(21) Appl. No.: 16/295,647

(22) Filed: Mar. 7, 2019

Related U.S. Application Data (60) Provisional application No. 62/692,931, filed on Jul. 2, 2018.

(51) Int. Cl.
*H02S 40/44* (2014.01)
*H02S 40/22* (2014.01)
*H02S 20/30* (2014.01)
*H02S 40/42* (2014.01)
*F24S 23/74* (2018.01)
*F24S 23/70* (2018.01)

(52) U.S. Cl.
CPC ............ *H02S 40/44* (2014.12); *F24S 23/74* (2018.05); *H02S 20/30* (2014.12); *H02S 40/22* (2014.12); *H02S 40/425* (2014.12); *F24S 2023/872* (2018.05)

(58) Field of Classification Search
CPC .......... H02S 10/00; H02S 40/44; H02S 40/22; H02S 40/425; H01L 31/052
See application file for complete search history.

(56) References Cited

U.S. PATENT DOCUMENTS

| | | | | |
|---|---|---|---|---|
| 4,052,228 A | * | 10/1977 | Russell | H01L 31/052 136/246 |
| 4,491,681 A | * | 1/1985 | Kirpich | F24S 10/75 136/246 |
| 4,700,013 A | | 10/1987 | Soule | |

(Continued)

FOREIGN PATENT DOCUMENTS

| | | | | |
|---|---|---|---|---|
| DE | 19837189 C1 | * | 9/1999 | F24J 2/14 |
| WO | 2005074041 | | 8/2005 | |
| WO | 2015101692 | | 7/2015 | |

OTHER PUBLICATIONS

FIT translation of DE 198 37 189 C1 (Year: 1999).*

(Continued)

*Primary Examiner* — Golam Mowla
(74) *Attorney, Agent, or Firm* — Head, Johnson, Kachigian & Wilkinson, PC (57) ABSTRACT

A photovoltaic retrofit device for a concentrating solar thermal power plant having a parabolic trough reflector, and a fluid receiver with working fluid therein spaced from the reflector and positioned at a focal point of the reflector. The photovoltaic device includes a plurality of adjustable angle dichroic mirrors positioned between the parabolic trough reflector and the fluid receiver. A photovoltaic receiver assembly has multiple photovoltaic panels in angular relationship to each other. A photovoltaic temperature regulating system includes a fluid medium to regulate temperature of the photovoltaic panels.

13 Claims, 10 Drawing Sheets

(56) References Cited

U.S. PATENT DOCUMENTS

| | | | | |
|---|---|---|---|---|
| 4,771,764 | A | * | 9/1988 | Cluff ................... H02S 40/425 |
| | | | | 136/246 |
| 8,455,755 | B2 | | 6/2013 | Correia et al. |
| 9,773,934 | B2 | | 9/2017 | Wheelwright et al. |
| 2010/0319684 | A1 | | 12/2010 | Almogy et al. |
| 2011/0114154 | A1 | | 5/2011 | Lichy et al. |
| 2012/0192922 | A1 | * | 8/2012 | Waring ................. F24S 30/425 |
| | | | | 136/246 |
| 2015/0059819 | A1 | * | 3/2015 | Nomura ................. H10N 10/13 |
| | | | | 136/206 |
| 2015/0372640 | A1 | * | 12/2015 | Yang ..................... F24S 30/425 |
| | | | | 136/248 |
| 2016/0099367 | A1 | * | 4/2016 | Wheelwright .......... H02S 40/22 |
| | | | | 136/248 |

OTHER PUBLICATIONS

ARPA-E; Full-Spectrum Optimized Conversion and Utilization of Sunlight; https://arpa-e.energy.gov/?q=arpa-e-programs/focus; Feb. 6, 2014.

Raush, Jonathan Richard; Chambers, Terrence Lynn; Initial Field Testing of Concentrating Solar Photovoltaic (CSPV) Thermal Hybrid Solar Energy Generator Utilizing Large Aperture Parabolic Trough and Spectrum Selective Mirrors, International Journal of Sustainable and Green Energy. vol. 3, No. 6, 2014, pp. 123-131; Nov. 20, 2014; doi: 10.11648/j.ijrse.20140306.12.

\* cited by examiner

PHOTOVOLTAIC DEVICE FOR ENHANCING POWER OUTPUT OF CONCENTRATING SOLAR THERMAL POWER PLANTS

2. CROSS-REFERENCE

This application is based on and claims priority to U.S. Provisional Patent Application Serial No. 62/692,931, filed Jul. 2, 2018, which is incorporated herein in its entirety by reference.

1. FEDERALLY SPONSORED RESEARCH OR DEVELOPMENT

This invention was developed with the assistance of the Advanced Research Projects Agency—Energy (ARPA-E) grant (DE-AR0000729). The U.S. Government may have rights in this invention.

BACKGROUND OF THE INVENTION

3. Field of the Invention

The present invention is directed to a combined concentrating solar thermal power plant and photovoltaic electric generation device. In particular, in one configuration, the present invention is directed to a photovoltaic retrofit device for enhancing power output of concentrating solar thermal power plants.

4. Description of the Related Art

Concentrating solar power plants are known power generation systems. In one configuration, concentrating linear parabolic troughs are utilized. The parabolic trough consists of a linear parabolic reflector. Mirrors or lenses of the troughs are used to focus sunlight. A large area of sunlight or solar thermal energy is concentrated onto a small area. The concentrated light is focused to produce heat which heats a fluid. The fluid is used to drive a heat engine, such as a steam turbine, in order to generate electrical power. A receiver is a tube positioned above the middle of the parabolic trough and filled with a working fluid, such as molten salt. The heated fluid may be passed to a heat engine or stored until needed for use.

There have been proposals in the past to combine photovoltaic electrical generation with concentrating solar thermal power generation. Raush ("Initial field testing of concentrating solar photovoltaic (CSPV) thermal hybrid solar energy generator utilizing large aperture parabolic trough and spectrum selective mirrors," International Journal of Sustainable and Green Energy, 2014, 3(6): 123-131), proposed utilizing spectral beam splitting of a portion of the spectrum to photovoltaic cells with the remaining spectrum directed to a thermal receiver.

Photovoltaic concentrators have also been proposed, such as seen in Correia et al. (U.S. Pat. No. 8,455,755). At the same time, it has been proposed to modify photovoltaic systems to include a cooling mechanism to gather heat from the photovoltaic collectors and utilize the heat gathered for other purposes, such as in Almogy et al. (U.S. Pat. Publ. No. 2010/0319684).

Notwithstanding the foregoing, there is still a need to provide a combined concentrating solar thermal power plant with a photovoltaic electric generation system for optimized power generation.

There is also a need to develop a photovoltaic retrofit device which would be easily utilized to enhance power output of concentrating solar thermal power plants.

There is also a need to boost electrical output of existing concentrating solar thermal power plants.

There is also a need to develop a combined concentrating solar thermal power plant with photovoltaic solar collectors to efficiently harness solar power by splitting concentrated solar light into at least two bands—a first band reflected to a photovoltaic cell array or arrays and a second band directed to the concentrating solar thermal power plant.

SUMMARY OF THE INVENTION

The present invention is directed to a photovoltaic retrofit device for enhancing power output of a concentrating solar thermal power plant. The photovoltaic device may be combined with a concentrating solar thermal power plant or retrofit to an existing solar thermal power plant.

The concentrating solar thermal power plant includes a parabolic reflector trough assembly having a reflector or reflectors.

The trough assembly includes a plurality of trough arms which hold the reflectors in place. The trough arms are mounted on and rotate along with a tube which has an axis substantially parallel to ground.

Additionally, the tube of the trough assembly is mounted for radial rotation about an axis perpendicular to the tube axis on a rotator assembly which is, in turn, mounted on a stand tube mounted on a base plate so that the stand tube is substantially perpendicular to ground. Accordingly, the reflector trough assembly may be positioned for optimum solar collection.

Spaced from the parabolic reflector trough assembly and positioned at a focal point of the reflectors is a fluid receiver assembly.

The fluid receiver assembly includes a fluid receiver in the form of an elongated tube through which working fluid is passed. Fluid may be pumped or otherwise moved into and through the tube and then delivered to a heat engine in order to produce electricity.

A fluid receiver mounting assembly retains the fluid receiver assembly in position spaced from the parabolic trough reflector or reflectors. The fluid receiver mounting assembly includes a support base which is mechanically attached to the tube. Extending from the support base are a series of support tubes which converge at a bracket.

A plurality of adjustable angle dichroic mirrors are positioned between the parabolic trough reflector or reflectors and the fluid receiver. The dichroic mirrors have different reflection or transmission properties at different wavelengths. The mirrors may be configured as a pair of dichroic mirror panels with each panel having a first edge connected to a hinge or pivot. Each mirror panel also has an opposed outer edge connected to an angle tuning mechanism which may include a series of turnbuckles. By increasing or decreasing the length of the turnbuckles, the angular position of the dichroic mirrors may be adjusted.

A photovoltaic receiver assembly is spaced from the dichroic mirrors and also mounted on the fluid receiver mounting assembly. The photovoltaic receiver assembly includes a plurality of photovoltaic panels mounted thereon. In one embodiment, the photovoltaic receiver assembly includes a housing which is triangular in cross-section with the panels mounted on at least two of the faces of the triangular assembly. A fluid medium is passed through the photovoltaic receiver assembly in order to regulate the temperature of the photovoltaic panels.

DETAILED DESCRIPTION OF THE INVENTION

The embodiments discussed herein are merely illustrative of specific manners in which to make and use the invention and are not to be interpreted as limiting the scope.

While the invention has been described with a certain degree of particularity, it is to be noted that many modifications may be made in the details of the invention's construction and the arrangement of its components without departing from the scope of this disclosure. It is understood that the invention is not limited to the embodiments set forth herein for purposes of exemplification.

Figure 1:
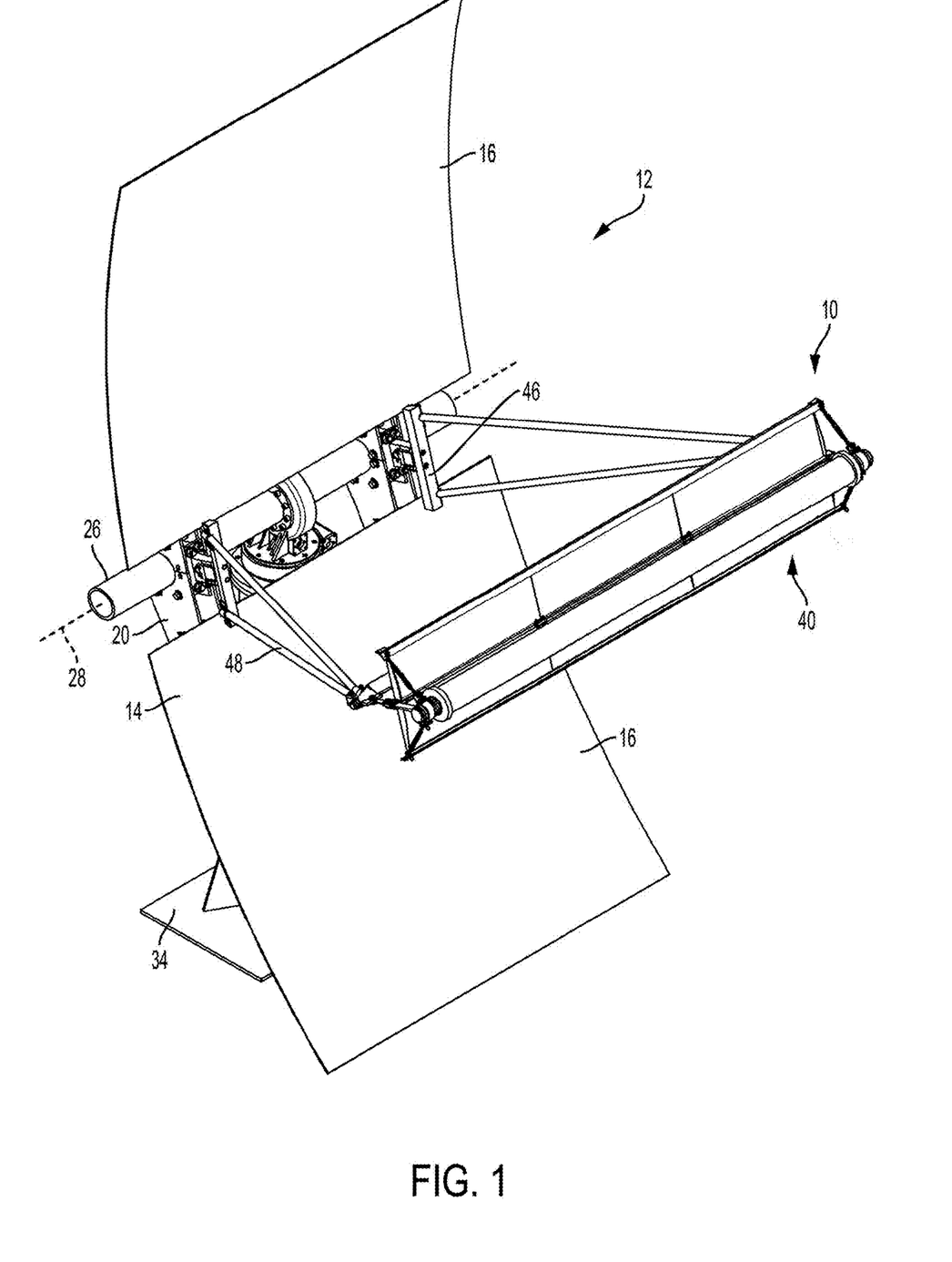
FIGS. 1 and 2 illustrate alternate perspective views of a photovoltaic device for enhancing power output of a concentrating solar thermal power plant constructed in accordance with the present invention.
Figure 2:
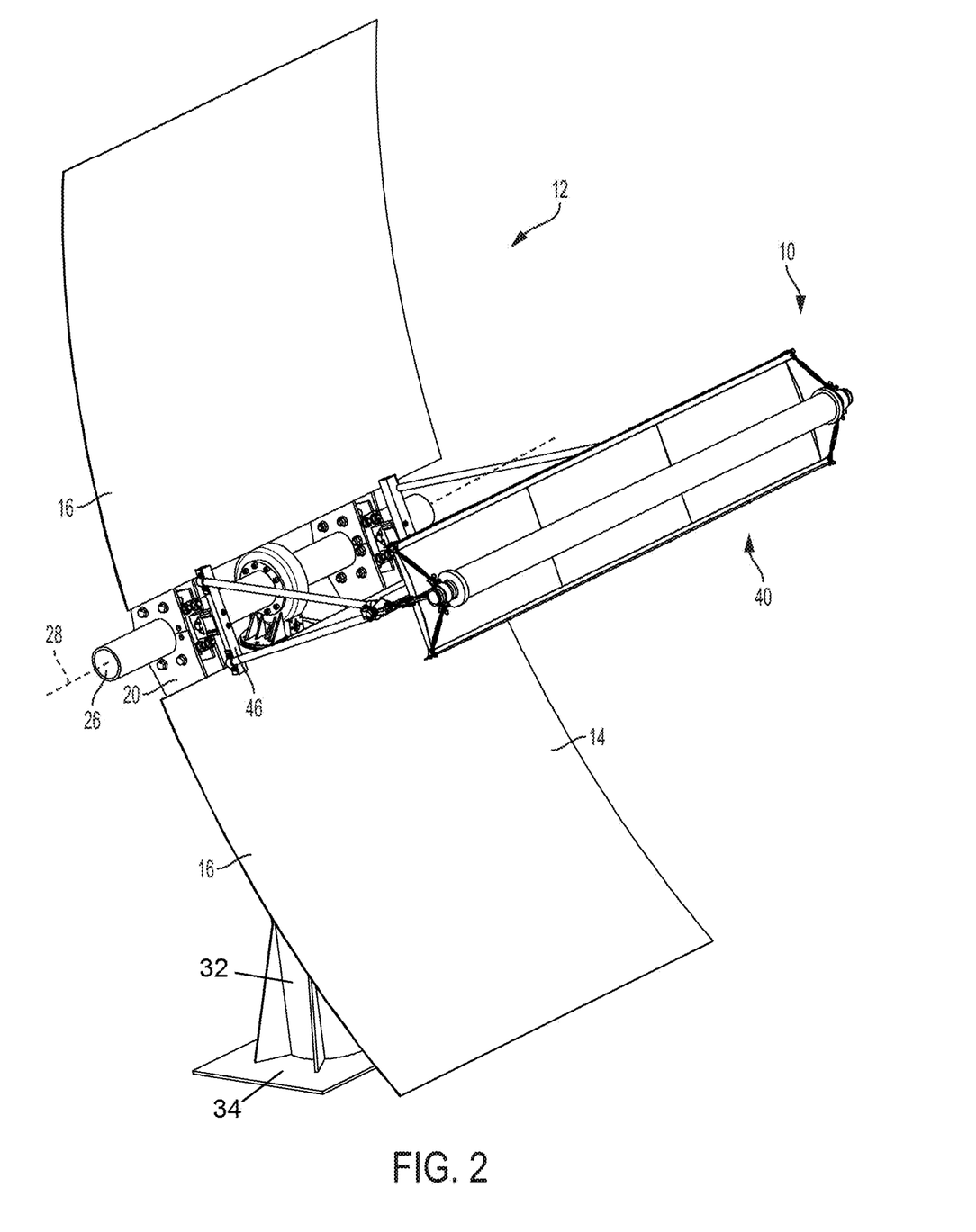

Referring to the drawings in detail, FIGS. 1 and 2 illustrate alternate perspective views of a photovoltaic device 10 for enhancing power output of a concentrating solar thermal power plant in accordance with the present invention. The photovoltaic device may be combined with a concentrating solar thermal power plant or retrofit to an existing solar thermal power plant.

A concentrating solar thermal power plant 12 includes a parabolic reflector trough assembly 14. The reflector trough assembly 14 includes a linear parabolic reflector or reflectors 16.

The reflector trough assembly 14 includes a plurality of trough arms 20 which hold the reflectors 16 in place. The trough arms 20 are mounted on a tube 26 which has an axis 28 (shown by dashed lines) which is substantially parallel to ground (not shown). Both the trough assembly 14 and the tube 26 rotate with respect to the power plant. The trough assembly 14 is designed to rotate about the axis 28 of the tube 26 in order to be positioned efficiently for capture of solar light.

Additionally, the tube 26 of the trough assembly is mounted for radial rotation about an axis perpendicular to axis 28 on a rotator assembly 30 which, in turn, is mounted on a stand tube 32 mounted on a base plate 34. The stand tube 32 is substantially perpendicular to ground (not shown). Accordingly, the reflector trough assembly 14 may be positioned for optimum solar collection.

Spaced from the parabolic reflector trough assembly 14 and positioned at a focal point of the reflectors 16 is a fluid receiver assembly 40.

Figure 3:
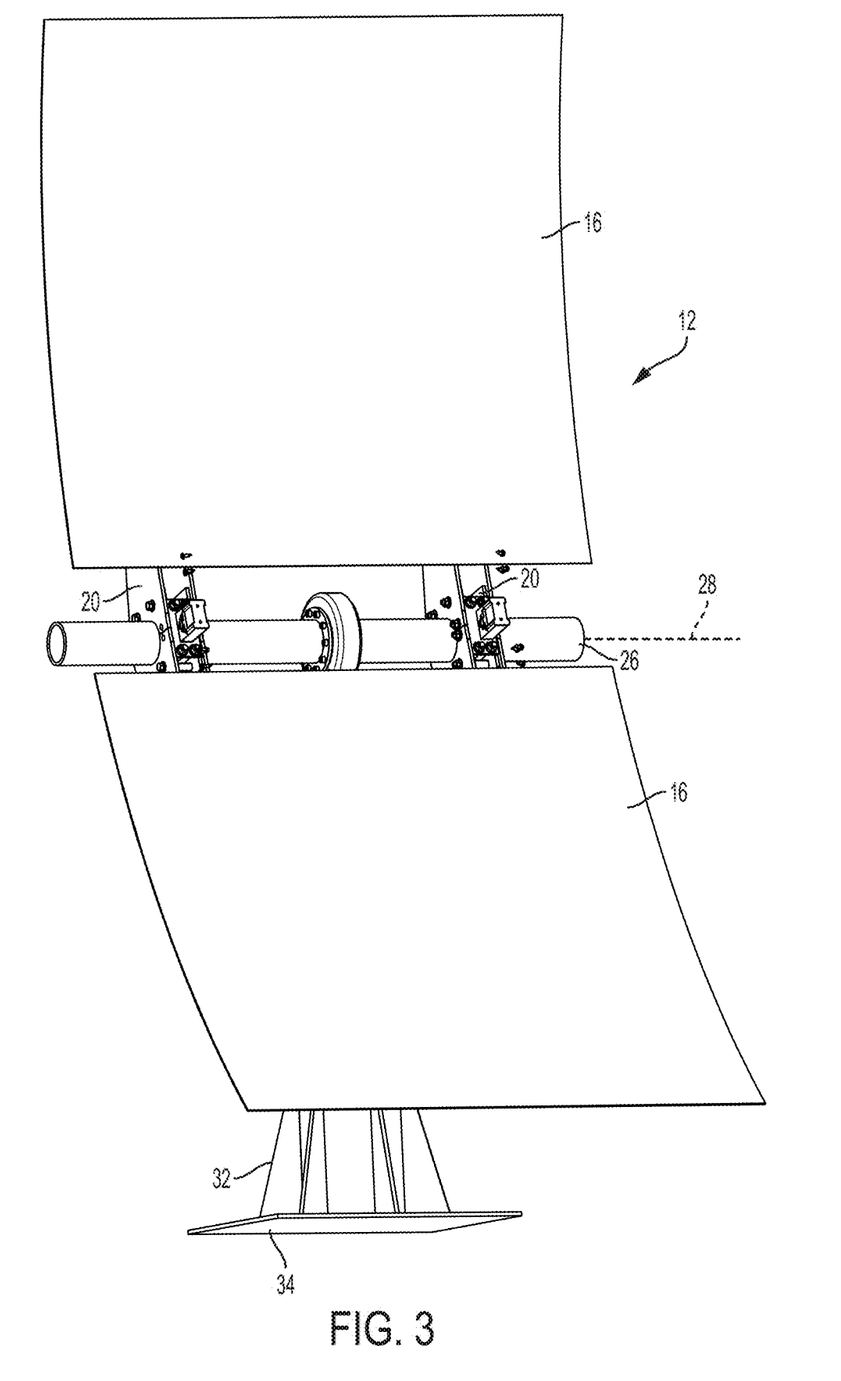
FIG. 3 illustrates a perspective view of a parabolic reflector trough assembly of the concentrating solar thermal power plant with the fluid receiver assembly removed for clarity.
Figure 4:
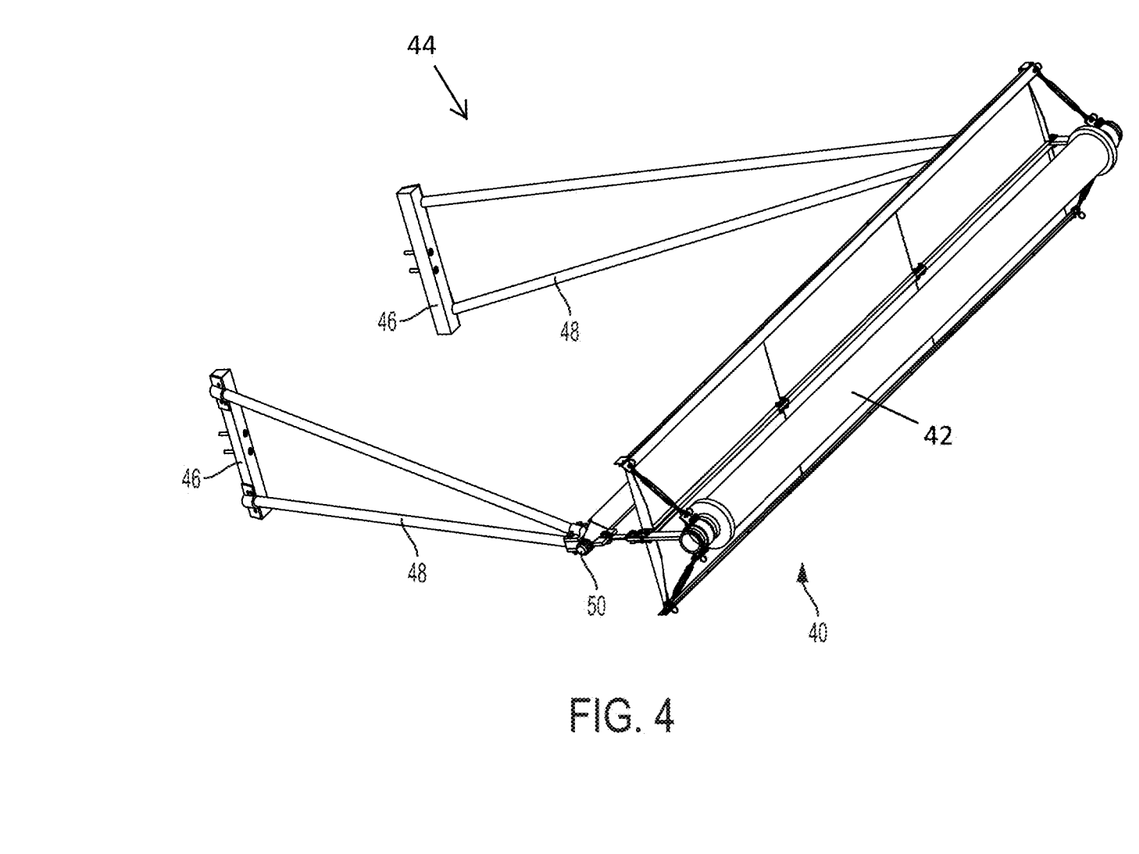
FIG. 4 illustrates a perspective view of the fluid receiver assembly apart from the parabolic reflector trough assembly.
Figure 5:
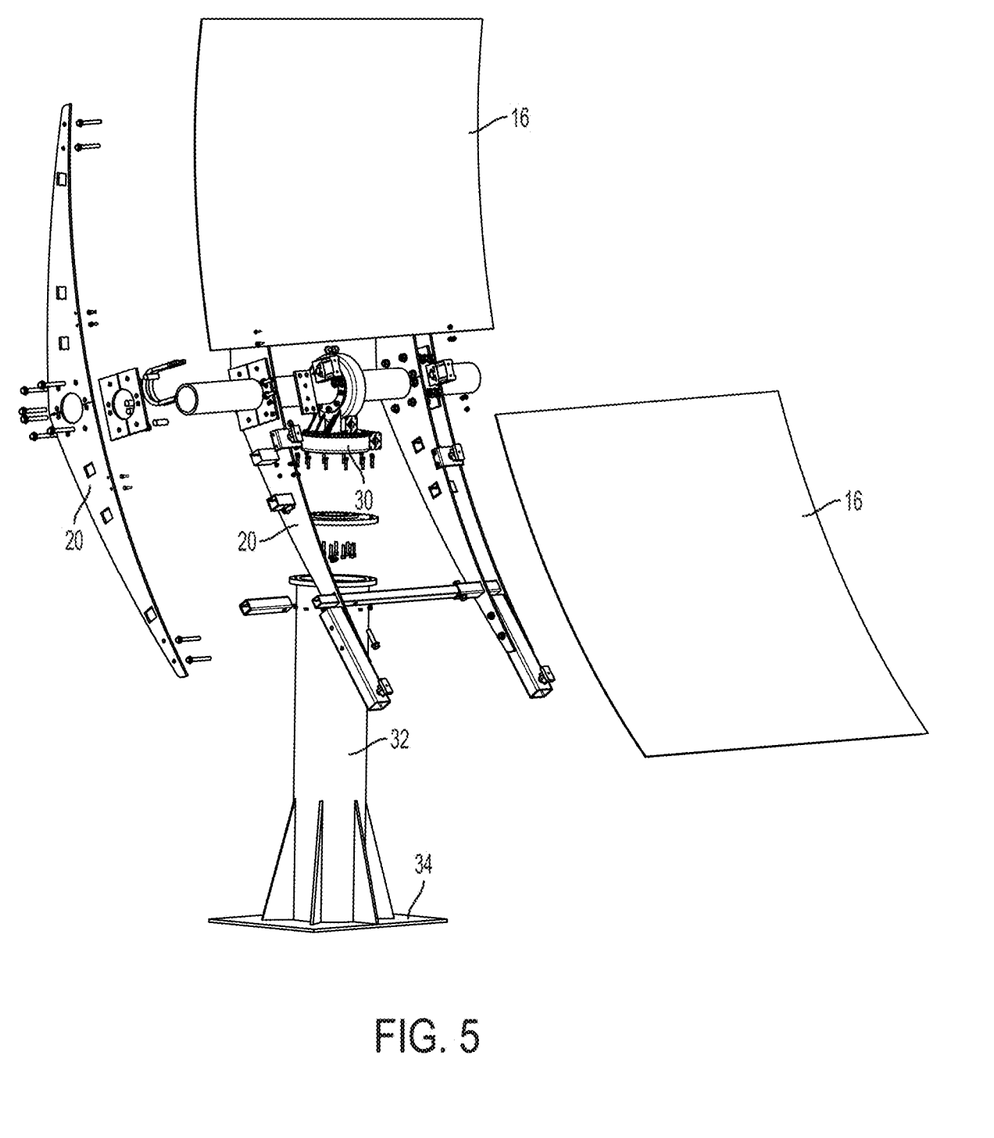
FIG. 5 shows an exploded view of the parabolic reflector trough assembly.

FIG. 3 illustrates a perspective view of the parabolic reflector trough assembly 14 with the fluid receiver assembly 40 removed for clarity, while FIG. 4 illustrates a perspective view of the fluid receiver assembly 40 apart from the trough assembly 14. Additionally, FIG. 5 shows an exploded view of the reflector trough assembly 14.

The fluid receiver assembly 40 includes a fluid receiver 42 in the form of an elongated tube through which working fluid (not shown) is passed. Water, glycol, or molten salt are examples of fluids that may be utilized as the working fluid. The working fluid may be pumped or otherwise moved into and through the tube and then be delivered to a heat engine. In one non-limiting example, the heated fluid may be used to produce steam which may be used to power a turbine to produce electricity. The working fluid releases heat and is later recirculated back through the fluid receiver 42 in a continuous process.

A fluid receiver mounting assembly 44 retains the fluid receiver assembly 40 in position spaced from the parabolic trough reflector or reflectors 16 and positioned at a focal point thereof.

The fluid receiver mounting assembly 44 includes a support base 46 which is mechanically attached to the tube 26. Extending from the support base 46 are a series of support tubes 48 which converge at a bracket 50.

Figure 6:
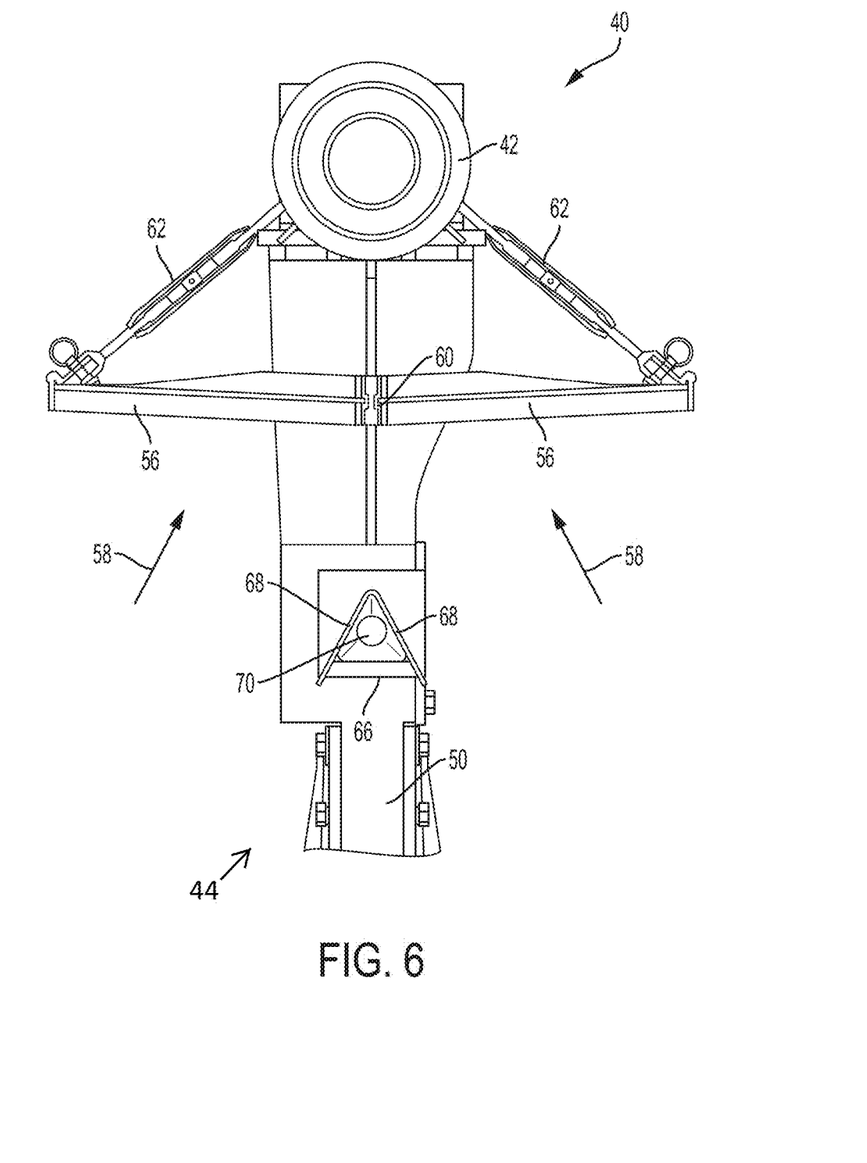
FIG. 6 illustrates an enlarged end view of a portion of the fluid receiver mounting assembly, and the fluid receiver.
Figure 7:
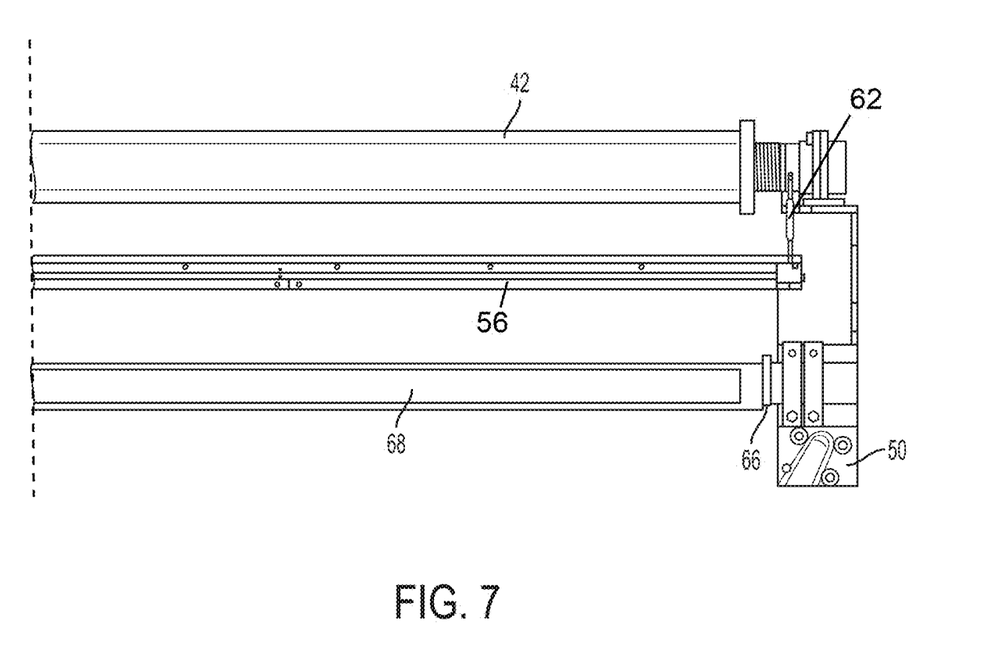
FIG. 7 illustrates an enlarged side view of the fluid receiver mounting assembly and the fluid receiver shown in FIG. 6.

FIG. 6 illustrates an enlarged end view of the bracket 50, the fluid receiver mounting assembly 44, and the fluid receiver 42, while FIG. 7 illustrates a side view thereof.

A plurality of adjustable angle dichroic mirrors 56 are positioned between the parabolic trough reflector or reflectors 16 and the fluid receiver 42. Arrows 58 illustrate the sunlight directed from the reflector troughs 16 toward the fluid receiver 42. The dichroic mirrors 56 have different reflection or transmission properties at different wavelengths.

The dichroic mirrors 56 may be configured in a pair of dichroic mirror panels with each panel 56 having a first inner edge connected to a hinge or pivot 60. Each panel also has an opposed second outer edge connected to an angle tuning mechanism. In one non-limiting configuration, the angle tuning mechanism is a series of turnbuckles 62. By increasing or decreasing the length of the turnbuckles 62, the angular position of the dichroic mirrors 56 may be adjusted.

A photovoltaic receiver assembly 66 is spaced from the dichroic mirrors 56 and also mounted on the fluid receiver mounting assembly 44.

The photovoltaic receiver assembly 66 includes a plurality of photovoltaic panels 68 mounted thereon. The photovoltaic receiver assembly 66 includes a housing which is triangular in cross-section with the photovoltaic panels 68 mounted on at least two of the faces or edges of the triangular receiver assembly 66.

A fluid medium 70, such as water or glycol, is passed through the photovoltaic receiver assembly 66 to regulate the temperature of the panels.

Figure 8:
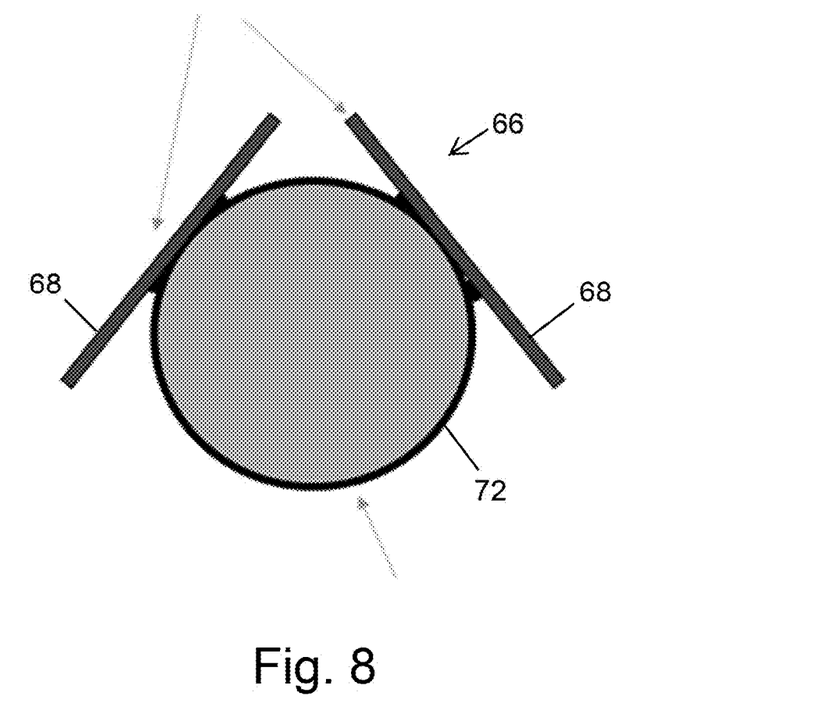
FIG. 8 illustrates an alternate configuration of the fluid receiver assembly.

In an alternate configuration seen in FIG. 8, the photovoltaic panels 68 are mounted on a housing 72 having a circular cross-section by welding, adhesive, or other mechanism.

In one embodiment, the dichroic mirrors 56, photovoltaic receiver assembly 66 and associated support hardware are retrofit to the existing concentrating solar thermal power plant. The invention has the ability to adjust the dichroic mirror focal point, allowing for fine tuning of the concentrated solar energy on the photovoltaic receiver, by varying the angle at which they are deployed.

The current design employs flat mirrors but curved mirrors are possible. The dichroic mirrors could be fabricated using chemical vapor deposition techniques and/or thin plastic film coating on a glass substrate. The mirrors have a transmittance exceeding 90% for a tunable upper (700-1200 nm) wavelength and lower wavelength (300-500 nm). The wavelengths are set by the cell material chosen for the photovoltaic receiver, as well as by the fraction of energy to be converted to heat versus directly to electricity. In between the upper and lower wavelengths, the dichroic mirror coating will have a high reflectance (>90%). The mirror width can be adjusted to control the amount of solar energy captured by the mirrors, i.e. shorter mirrors results in more flux to the existing concentrating solar thermal receiver.

The photovoltaic receiver has a triangular cross-section with an open internal section to allow for active cooling by flowing a fluid medium down the length of the assembly 66. The angle of the sides of the triangular housing is designed to maximize flux of the photovoltaic cells but can be varied to accommodate further design variants. The distance from the existing solar power receiver 42 is tuned to accommodate the inclusion of the dichroic mirrors 56 and to ensure focus on the photovoltaic receiver.

Photovoltaic string wiring layout and power electronics are strategically employed to counter known losses due to current and voltage mismatch induced by temperature and irradiance variation. Because the orientation of photovoltaic (PV) cells in a line focus concentrator is along the axis of coolant flow, a temperature gradient will occur that reduces voltage of the cells in the direction of flow. Optical variations causing irradiance differences along the receiver target will result in differential individual photovoltaic cell current that drags down the string current. Using an economic objective function, the most efficient strategy for controlling the sources of these losses may be deployed. The present invention optimizes the power evacuation from strings of photovoltaic cells by balancing between granularity of power takeoff using power electronics (maximum power point trackers) against the losses of string lengths exceeding a breakeven performance point.

Single junction solar cells are comprised of a single bandgap material. Multi junction (MJ) solar cells are comprised of multiple materials, each operating at different bandgap levels. MJ cells are inherently more efficient in converting solar energy into electricity because of the highly efficient conversion over narrow wavelengths of light associated with any PV cell. Combining a single junction into a multi junction cell takes advantage of that benefit. The efficiency of MJ cells is higher than single junction cells but orders of magnitude more expensive limiting their practical applications. The decision to focus on single junction cells here is driven by the desire to minimize cost. Additionally, the spectral filtering of light from the dichroic mirror limits the wavelengths reflected to the PV cell, allowing it to operate more efficiently.

Figure 9:
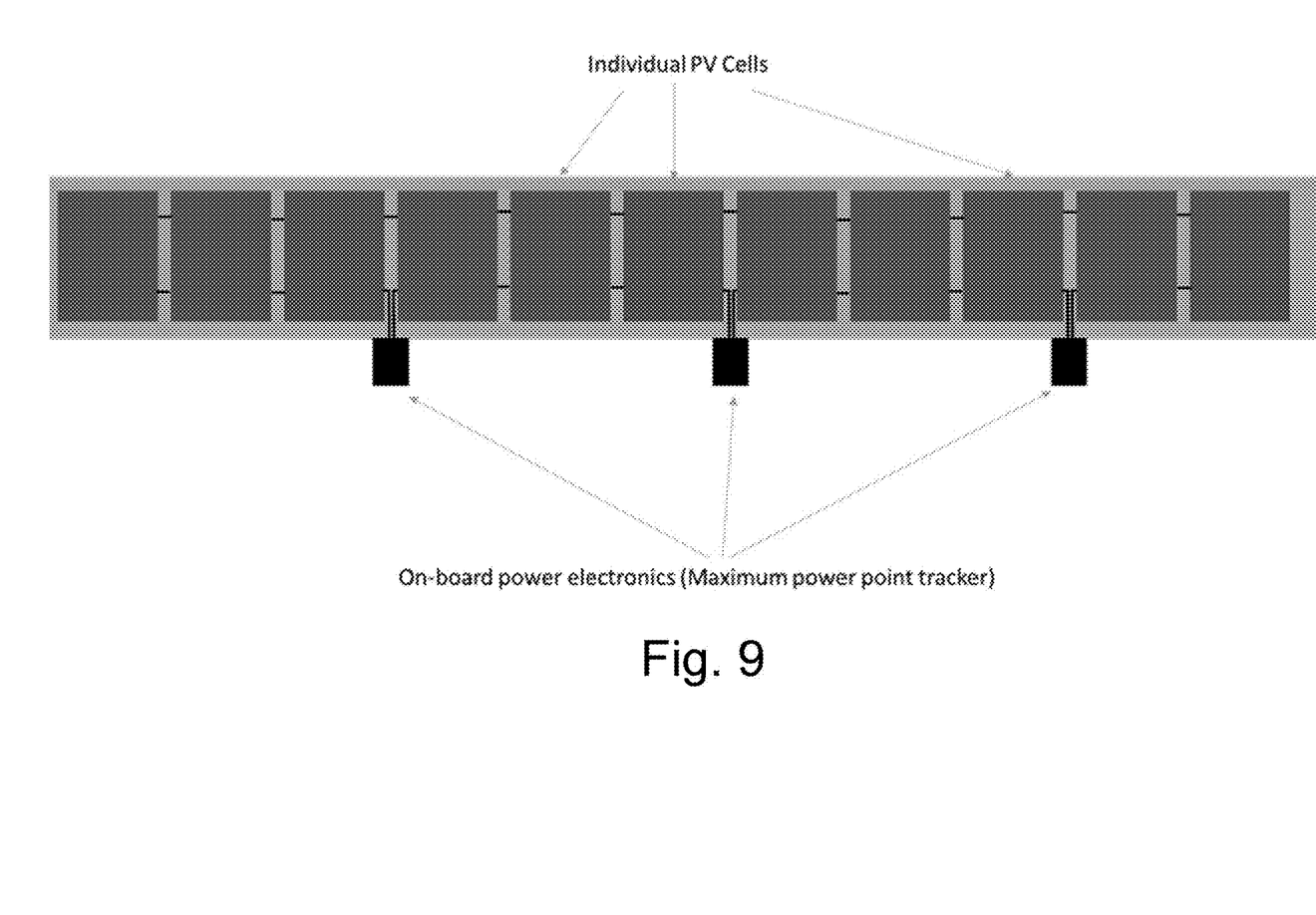
FIG. 9 illustrates an example of a layout of photovoltaic panels on a photovoltaic receiver assembly.

The present invention also includes a number of other features. On-board power electronics is used to minimize cell-to-cell mismatch. The miniaturization of electronics enables the use of maximum power point tracker (MPPT) technology at sub module levels. As shown in FIG. 9, MPPT electronics can be added (shown here for every three cells) but could be envisioned for single cell level up to a full module level (32 cells) or any combination in between as needed to balance cost and performance.

Combining photovoltaic (PV) and thermal technologies into hybrid solar energy systems captures the full solar spectrum at low cost and with the ability for dispatching thermal energy when needed to better match the demand from the grid. The present invention may be retrofit to existing concentrating solar thermal power plants to provide enhanced plant electrical output at costs lower than photovoltaic installations.

The system can "bolt-on" to existing parabolic troughs where a dichroic mirror element selectively reflects a portion of the incoming solar spectrum onto a cooled PV receiver. A portion of the remaining solar energy is transmitted through the dichroic mirror or mirrors to the existing thermal receiver. The invention has the potential to boost existing concentrating solar thermal power plant electrical output by 20% at an installed cost 30% less than an equivalent photovoltaic array of the same capacity. The design leverages the sunk capital costs of the existing concentrating solar thermal power plant's primary optics and heat collection elements while adding low cost elements that can boost the overall plant electrical output.

Figure 10:
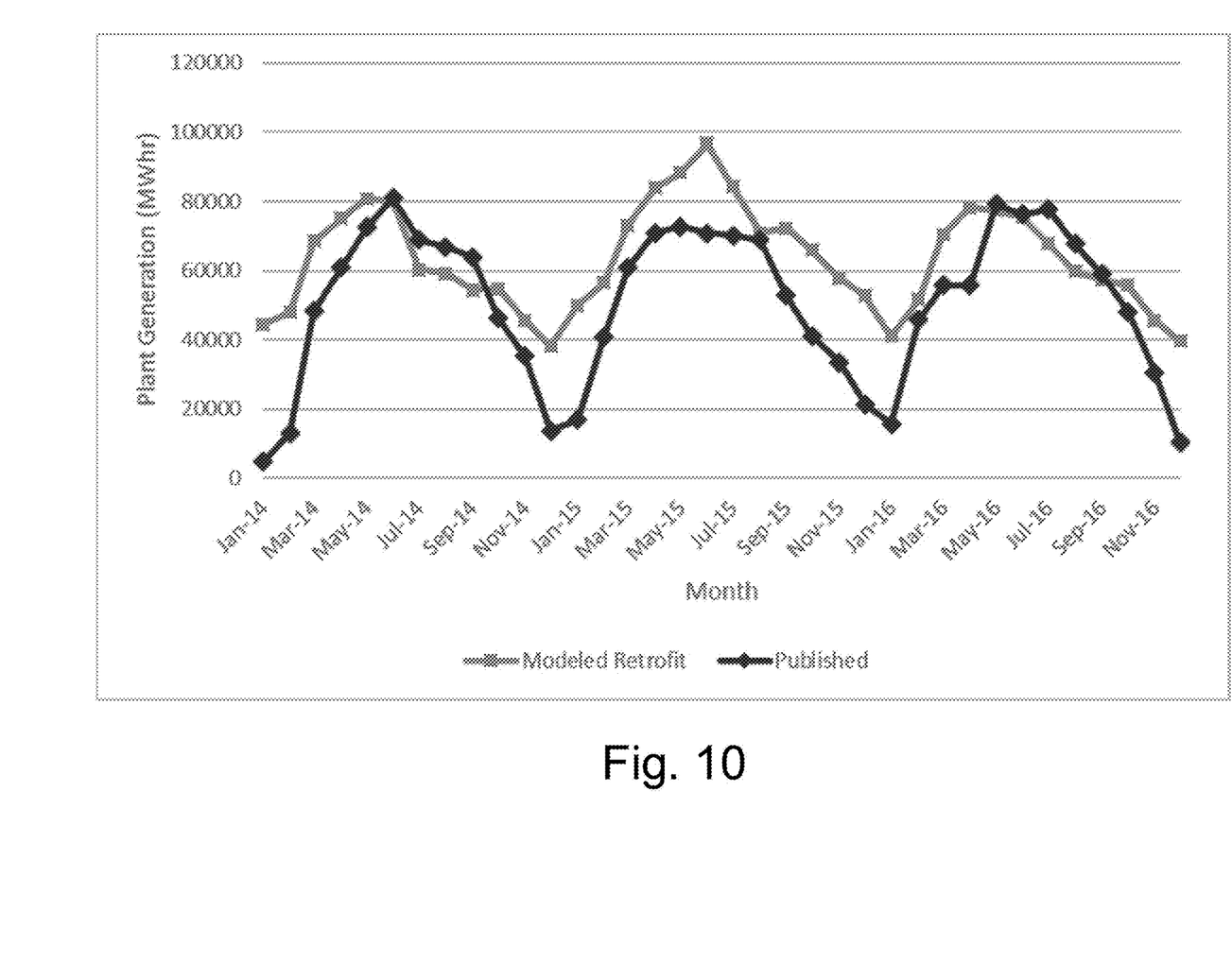
FIG. 10 is a chart showing electrical output of an existing concentrating solar power plant comparing published output versus modeled output with a photovoltaic device.

In one example of application of the present invention, the overall yield of an existing CSP plant was modeled using known physics operational principles. The model was then extended to cover the addition of the dichroic and PV receiver. This model was used to compare the yearly production of an existing CSP plant, the Genesis plant in Blythe CA, versus the same plant fit with the dichroic and PV receiver. As can be seen in the chart in FIG. 10, the output generation of the plant is increased over the published operational data of the Genesis plant. Over the course of a single year, the net electrical output of the plant is increased by ~25%. As can be seen, the retrofit, hybrid CSP-CPV approach significantly outperforms the CSP plant outside of summer months, while during the summer months the performance difference is reduced or negligible. One driver for this is the reduced ambient temperatures outside of summer resulting in increased PV performance and reduced CSP performance from increased thermal losses. Further, the drop-in performance of the CPV components is smaller than the CSP system at lower values of irradiance as the CPV system losses are less dependent on irradiance.

The dichroic mirrors split incoming solar light into two bands. One is reflected to photovoltaic cells that convert the sunlight directly to electricity at a higher fractional efficiency and lower cost than the thermal route. The remaining light is used in the existing thermal portion of the power plant.

Whereas, the invention has been described in relation to the drawings attached hereto, it should be understood that other and further modifications, apart from those shown or suggested herein, may be made within the scope of this invention.

What is claimed is:

1. A photovoltaic retrofit device for a concentrating solar thermal power plant having a parabolic trough reflector, and a fluid receiver with working fluid therein spaced from said parabolic trough reflector and positioned at a focal point of said parabolic trough reflector, which device comprises:

one or more pairs of dichroic mirrors panels positioned between said parabolic trough reflector and said fluid receiver;

an angle tuning mechanism capable of angling each member of a pair of said panels independently on an axis parallel to said photovoltaic receiver assembly, where each of said panels has a first inner edge connected to a pivot having an axis parallel to said photovoltaic receiver assembly and a second outer edge connected to said angle tuning mechanism;

a photovoltaic receiver assembly having multiple photovoltaic panels in angular relationship to each other;

a photovoltaic temperature regulating system having a fluid medium to regulate temperature of said photovoltaic panels; and wherein said photovoltaic receiver assembly has a housing with each of said multiple photovoltaic panels mounted directly on an outer surface of said housing, said housing forming an open internal section for passage of said fluid medium therethrough; and wherein said one or more pairs of dichroic mirror panels, said photovoltaic receiver assembly, and said photovoltaic temperature regulating system are configured to be retrofit to a concentrating solar thermal power plant.

2. A photovoltaic retrofit device for a concentrating solar thermal power plant as set forth in claim 1 wherein said fluid receiver is mounted on a fluid receiver mounting assembly extending between said parabolic trough reflector and said fluid receiver.

3. A photovoltaic retrofit device for a concentrating solar thermal power plant as set forth in claim 1 wherein said angle tuning mechanism includes turnbuckles.

4. A photovoltaic retrofit device for a concentrating solar thermal power plant as set forth in claim 1 wherein said photovoltaic receiver assembly includes a housing which is triangular in cross-section.

5. A photovoltaic retrofit device for a concentrating solar thermal power plant as set forth in claim 4 wherein said fluid medium of said photovoltaic temperature regulating system passes through said triangular photovoltaic receiver assembly.

6. A photovoltaic retrofit device as set forth in claim 1 wherein said housing of said photovoltaic receiver assembly is circular in cross-section.

7. A photovoltaic retrofit device as set forth in claim 6 wherein said fluid medium of said photovoltaic temperature regulating system passes through said circular housing.

8. A photovoltaic retrofit device for a concentrating solar thermal power plant as set forth in claim 5 wherein said fluid medium is passed in heat exchange to cool said photovoltaic panels.

9. A photovoltaic retrofit device for a concentrating solar thermal power plant as set forth in claim 2 wherein said photovoltaic receiver assembly is mounted on said fluid receiver mounting assembly.

10. A combined photovoltaic and concentrating solar thermal power plant comprising:

a parabolic trough reflector, and a fluid receiver spaced from said parabolic trough reflector and positioned at a focal point of said trough reflector with working fluid therein, wherein said fluid receiver is mounted on a fluid receiver mounting assembly extending between said trough and said fluid receiver;

one or more pairs of dichroic mirrors panels positioned between said parabolic trough reflector and said fluid receiver;

an angle tuning mechanism capable of angling each member of a pair of said panels independently on an axis parallel to said photovoltaic receiver assembly, where each of said panels has a first inner edge connected to a pivot having an axis parallel to said photovoltaic receiver assembly and a second outer edge connected to said angle tuning mechanism;

a photovoltaic receiver assembly having multiple photovoltaic panels in angular relationship to each other, wherein said photovoltaic receiver assembly includes a housing;

a photovoltaic temperature regulating system having a fluid medium to regulate temperature of said photovoltaic panels; and wherein said photovoltaic receiver assembly has a housing with each of said multiple photovoltaic panels mounted directly on an outer surface of said housing, said housing forming an open internal section for passage of said fluid medium therethrough.

11. A combined photovoltaic and concentrating solar thermal power plant as set forth in claim 10 wherein said angle tuning mechanism includes turnbuckles.

12. A combined photovoltaic and concentrating solar thermal power plant as set forth in claim 10 wherein said housing is triangular in cross-section.

13. A combined photovoltaic and concentrating solar thermal power plant as set forth in claim 10 wherein said housing is circular in cross-section.

\* \* \* \* \*